(12) United States Patent
Yamanoi

(10) Patent No.: US 12,550,502 B2
(45) Date of Patent: Feb. 10, 2026

(54) LIGHT-EMITTING DEVICE

(71) Applicant: NICHIA CORPORATION, Anan (JP)

(72) Inventor: Takuya Yamanoi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 377 days.

(21) Appl. No.: 18/302,418

(22) Filed: Apr. 18, 2023

(65) Prior Publication Data

US 2023/0387365 A1    Nov. 30, 2023

(30) Foreign Application Priority Data

Apr. 19, 2022   (JP) ................ 2022-068956

(51) Int. Cl.
     *H10H 20/856*    (2025.01)

(52) U.S. Cl.
     CPC ................. *H10H 20/856* (2025.01)

(58) Field of Classification Search
     CPC .......... H10H 20/856; H10H 20/8506
     See application file for complete search history.

(56) References Cited

U.S. PATENT DOCUMENTS

| | | | |
|---|---|---|---|
| 7,830,079 B2 * | 11/2010 | Tamaki | H10H 20/856 313/498 |
| 2008/0054287 A1 | 3/2008 | Oshio et al. | |
| 2010/0193822 A1 | 8/2010 | Inobe et al. | |
| 2013/0037842 A1 | 2/2013 | Yamada et al. | |
| 2013/0183787 A1 | 7/2013 | Inobe et al. | |
| 2014/0087498 A1 | 3/2014 | Terayama et al. | |
| 2015/0034992 A1 | 2/2015 | Inobe et al. | |
| 2015/0092414 A1 | 4/2015 | Okura | |
| 2017/0062682 A1 | 3/2017 | Inobe et al. | |
| 2019/0140147 A1* | 5/2019 | Oh ............... | H10H 20/8506 |
| 2019/0252583 A1 | 8/2019 | Inobe et al. | |
| 2020/0006608 A1 | 1/2020 | Ozeki et al. | |
| 2021/0028339 A1 | 1/2021 | Kojima et al. | |
| 2021/0367118 A1 | 11/2021 | Ozeki et al. | |

(Continued)

FOREIGN PATENT DOCUMENTS

| | | |
|---|---|---|
| CN | 203631607 U | 6/2014 |
| CN | 206259383 U | 6/2017 |
| JP | 2005136378 A | 5/2005 |

(Continued)

*Primary Examiner* — Matthew L Reames
(74) *Attorney, Agent, or Firm* — Hunton Andrews Kurth LLP

(57) ABSTRACT

A light-emitting device includes a base member having a recess inside which a light-emitting element is disposed; and a light-reflective member continuously disposed on an upper surface of the bottom portion and at least a portion of an inner lateral surface of a wall portion inside the recess of the base member, in a cross-sectional view, the inner lateral surface of the wall portion having a first surface, a second surface located above the first surface, and a third surface connecting the first surface and the second surface, a shortest distance between the second surface and the light-emitting element being larger than a shortest distance between the first surface and the light-emitting element, the third surface being located below an upper surface of the light-emitting element, and an upper end of the light-reflective member being located below an upper surface of the wall portion.

20 Claims, 8 Drawing Sheets

(56) References Cited

U.S. PATENT DOCUMENTS

2023/0378408 A1    11/2023  Ozeki et al.

FOREIGN PATENT DOCUMENTS

| | | |
|---|---|---|
| JP | 2008060344 A | 3/2008 |
| JP | 2009295892 A | 12/2009 |
| JP | 2010199547 A | 9/2010 |
| JP | 2010219324 A | 9/2010 |
| JP | 2014022634 A | 2/2014 |
| JP | 2014082453 A | 5/2014 |
| JP | 2014158052 A | 8/2014 |
| JP | 2015070134 A | 4/2015 |
| JP | 2015070239 A | 4/2015 |
| JP | 2015070240 A | 4/2015 |
| JP | 2020010013 A | 1/2020 |
| JP | 2021022605 A | 2/2021 |
| KR | 20140069488 A | 6/2014 |
| WO | 2011099384 A1 | 8/2011 |

* cited by examiner

LIGHT-EMITTING DEVICE

CROSS-REFERENCE TO RELATED APPLICATIONS

The present application claims priority under 35 U.S.C. § 119 to Japanese Patent Application No. 2022-068956, filed Apr. 19, 2022, the contents of which are hereby incorporated by reference in their entirety.

BACKGROUND

1. Technical Field

The present disclosure relates to a light-emitting device.

2. Description of Related Art

As a light-emitting device, a light-emitting device is known that includes a light-emitting element such as an LED and a light-reflective member that reflects light from the light-emitting element inside a base member having a recess. For example, Japanese Unexamined Patent Application Publication No. 2008-060344 discloses a semiconductor light-emitting device including a molded body having a recess, a semiconductor light-emitting element mounted inside the recess, and a resin layer covering a bottom surface and a lateral surface of the recess of the molded body and having a high reflectance.

SUMMARY

An object of the present disclosure is to provide a light-emitting device having a high light extraction efficiency.

A light-emitting device according to an embodiment of the present disclosure includes a base member having a recess defined by a bottom portion and a wall portion located above the bottom portion, a light-emitting element disposed inside the recess, and a light-reflective member continuously disposed on an upper surface of the bottom portion and at least a portion of an inner lateral surface of the wall portion inside the recess of the base member. In a cross-sectional view, the inner lateral surface of the wall portion has a first surface continuous with the upper surface of the bottom portion, a second surface located above the first surface, and a third surface connecting an upper end of the first surface and a lower end of the second surface. A shortest distance between the second surface and the light-emitting element is larger than a shortest distance between the first surface and the light-emitting element. The third surface is located at the same height as an upper surface of the light-emitting element or below the upper surface of the light-emitting element. An upper end of the light-reflective member is located below an upper surface of the wall portion.

The present disclosure can provide a light-emitting device having a high light extraction efficiency.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENTS

Figure 1:
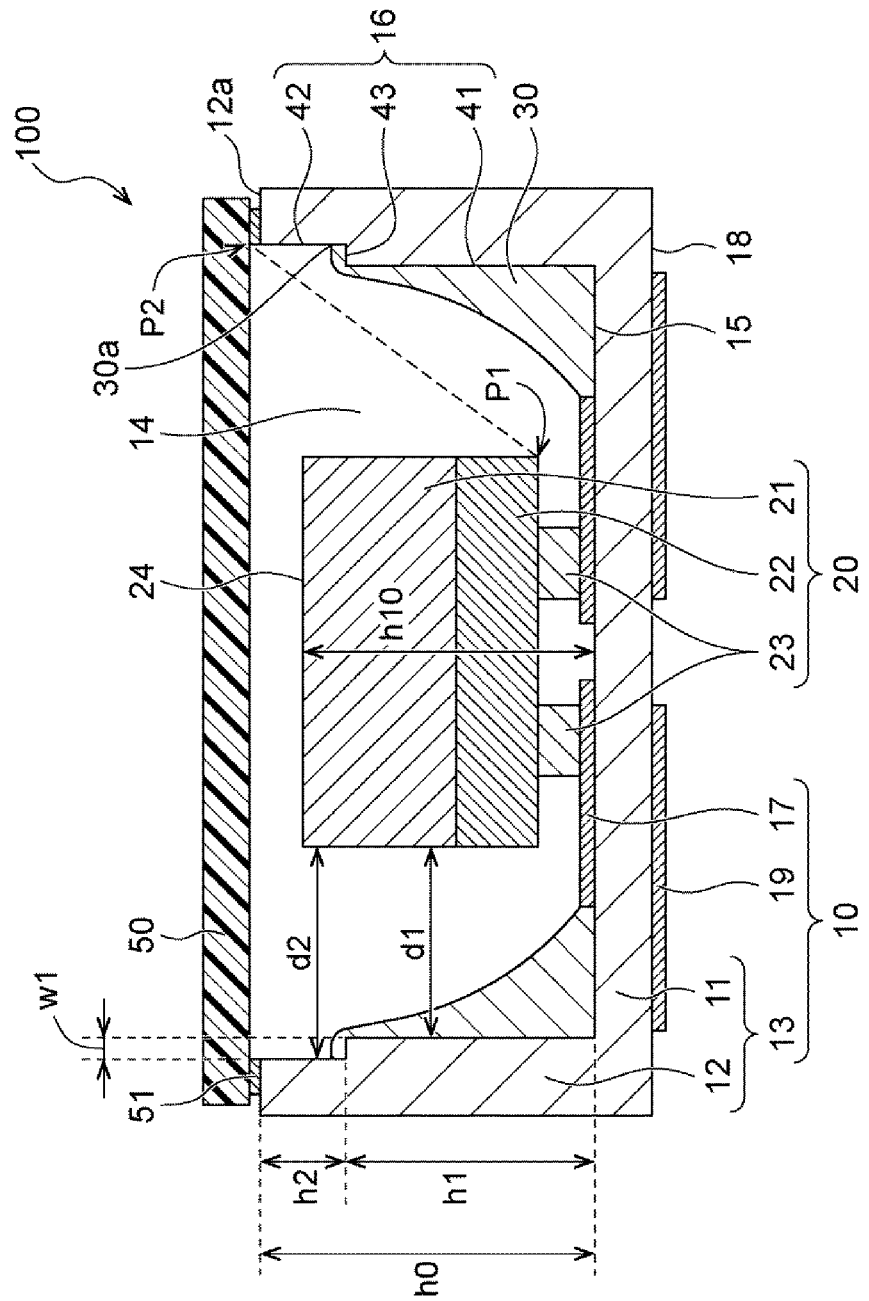
FIG. 1 is a schematic end view of a light-emitting device 100 according to a first embodiment of the present disclosure.

Certain embodiments for carrying out the invention according to the present disclosure will be described below with reference to the accompanying drawings. Light-emitting devices described below are intended to embody the technical idea of the invention according to the present disclosure. The invention according to the present disclosure is not limited to the embodiments below unless specifically stated otherwise. In the drawings, members having the same function may be denoted by the same reference numeral. For convenience or ease of explanation or understanding of the main points, the description below may be made for each embodiment, but the configurations of different embodiments can be partially replaced or combined. In the subsequent embodiments, description of matters in common with the preceding embodiments will be omitted, and only different points will be described. In particular, similar actions and effects provided by similar configurations are not mentioned for every embodiment. The sizes, positional relationships, and the like of members shown in the drawings may be exaggerated for clarity of descriptions. In some cases, a cross-sectional end view showing only the cut surface of a member is used for a cross-sectional view.

First Embodiment

Figure 2:
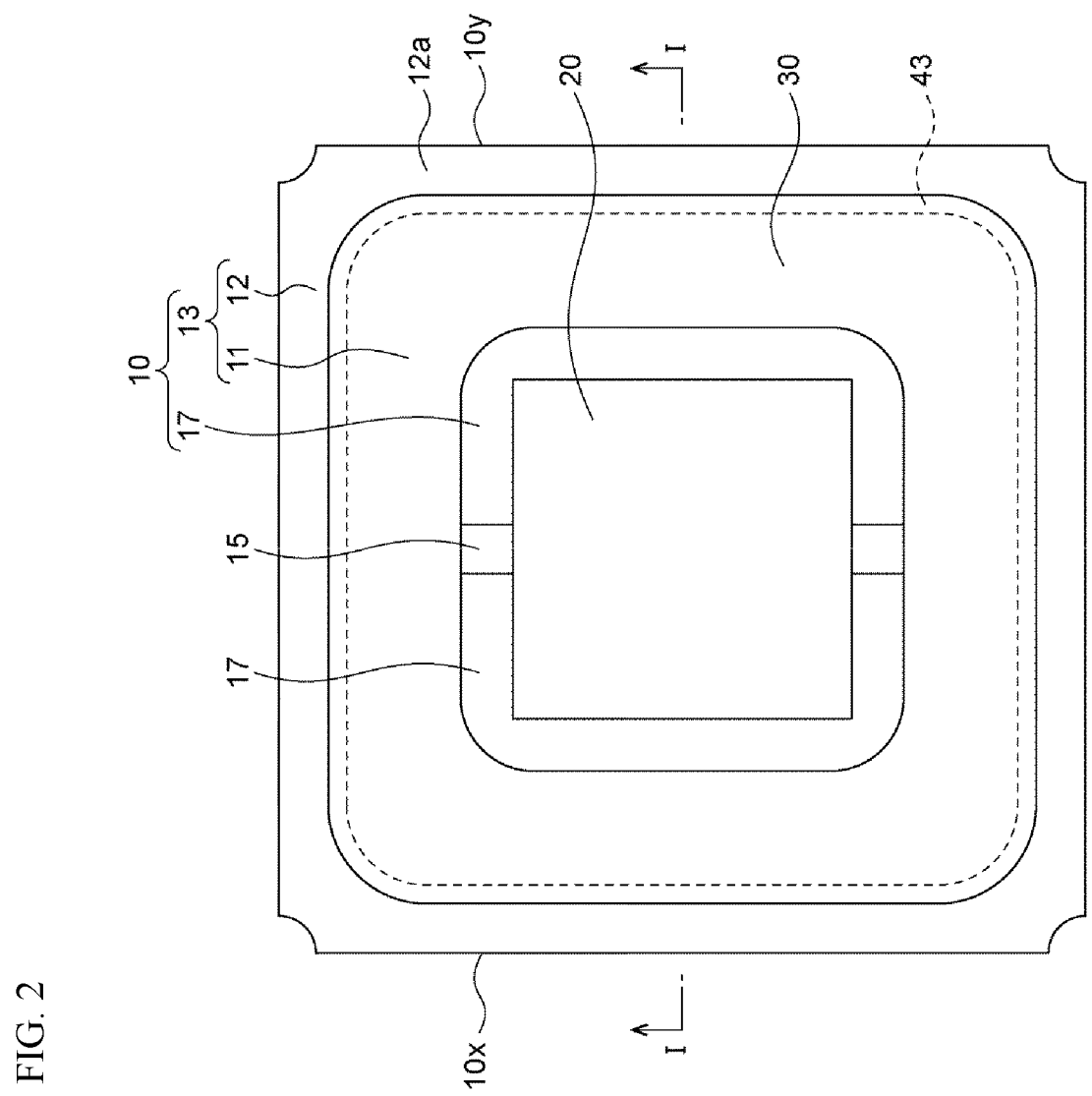
FIG. 2 is a schematic top view of the light-emitting device 100 according to the first embodiment shown in FIG. 1.

A light-emitting device 100 according to a first embodiment of the present disclosure will be described using FIG. 1 and FIG. 2. FIG. 1 is a schematic end view of the light-emitting device 100. FIG. 2 is a schematic top view of the light-emitting device 100. In FIG. 2, a light-transmissive member is omitted. The schematic end view of FIG. 1 shows the light-emitting device 100 cut along the line I-I shown in FIG. 2. In FIG. 2, the line I-I passes through the centers of two lateral surfaces 10x and 10y of a base member 10 facing each other. In the light-emitting device according to certain embodiment(s) of the present disclosure, the bottom portion side of the base member is regarded as the lower side, and the upper surface side of the light-transmissive member is regarded as the upper side. That is, the upper side in FIG. 1 is regarded as the upper side, and the lower side is regarded as the lower side.

As shown in FIG. 1 and FIG. 2, the light-emitting device 100 according to the first embodiment of the present disclosure includes the base member 10 having a recess 14 defined by a bottom portion 11 and a wall portion 12 located above the bottom portion 11, a light-emitting element 20 disposed inside the recess 14, and a light-reflective member 30 continuously disposed on an upper surface 15 of the bottom portion 11 and an inner lateral surface 16 of the wall portion 12 inside the recess 14 of the base member 10. In a cross-sectional view, the inner lateral surface 16 of the wall portion 12 includes a first surface 41 continuous with the upper surface 15 of the bottom portion 11, a second surface 42 located above the first surface 41, and a third surface 43 connecting an upper end of the first surface 41 and a lower end of the second surface 42. A shortest distance d2 between the second surface 42 and the light-emitting element 20 is larger than a shortest distance d1 between the first surface 41 and the light-emitting element 20, the third surface 43 is located at the same height as an upper surface 24 of the light-emitting element 20 or below the upper surface 24 of the light-emitting element 20, and an upper end 30a of the light-reflective member 30 is located below an upper surface 12a of the wall portion 12.

The light-emitting device 100 according to the first embodiment of the present disclosure includes a light-transmissive member 50 disposed on the upper surface 12a of the base member 10 with a bonding member 51 therebetween.

In a light-emitting device disclosed in Japanese Unexamined Patent Application Publication No. 2008-060344, the upper end of a resin layer disposed in a recess of a molded body is located about the same height as the upper surface of the molded body. The light-emitting device disclosed in Japanese Unexamined Patent Application Publication No. 2008-060344 has a step on a lateral surface of the recess of the molded body, and the upper surface of the light-emitting element is located below the step of the lateral surface of the recess. Therefore, in the light-emitting device disclosed in Japanese Unexamined Patent Application Publication No. 2008-060344, a larger portion of light emitted from the light-emitting element is applied to the resin layer located on the step and on a portion above the step. Accordingly, light emitted from the light-emitting device has a smaller proportion of light directly emitted out of the light-emitting device without being reflected by the resin layer. On the other hand, in the light-emitting device according to certain embodiment(s) of the present disclosure, the upper end 30a of the light-reflective member 30 is located below the upper surface 12a of the wall portion 12, and the third surface 43 of the wall portion is located at the same height as the upper surface 24 of the light-emitting element 20 or below the upper surface 24 of the light-emitting element 20, so that light emitted from the light-emitting element 20 has a larger proportion of light directly emitted out of the light-emitting device without being reflected by the light-reflective member 30. With this structure, the light extraction efficiency of the light-emitting device can be enhanced.

Base Member

The base member 10 includes the bottom portion 11 and the wall portion 12 located above the bottom portion 11. The bottom portion 11 and the wall portion 12 define the recess 14. The base member 10 can include a wiring layer 17 disposed on the upper surface 15 of the bottom portion 11 in the recess 14 and external electrodes 19 disposed on a lower surface 18 of the bottom portion 11.

As shown in FIG. 2, the outer edges of the wall portion 12 of the base member 10 have a substantially rectangular shape in a top view. Each corner portion of the rectangular shape has a circular arc indentation. The shape of the corner portion may have a right angle or may be rounded. The shape of the inner edges of the third surface 43 and the shape of the outer edges of the third surface 43 are substantially rectangular in a top view. Each corner portion of the rectangular shape has a rounded shape. The shapes of the inner edges and the outer edges of the third surface 43 may have corner portions having right angles.

In the light-emitting device according to certain embodiment(s) of the present disclosure, the shape of the outer edges of the wall portion of the base member is not limited to the above substantially rectangular shapes but may be any known shape such as a circular shape. The shape of the inner edges and the shape of the outer edges of the third surface are also not limited to the above substantially rectangular shapes but may be such a shape along the outer edges of the wall portion of the base member.

In a cross-sectional view, the inner lateral surface 16 of the wall portion 12 includes the first surface 41 continuous with the upper surface 15 of the bottom portion 11, the second surface 42 located above the first surface 41, and the third surface 43 connecting the upper end of the first surface 41 and the lower end of the second surface 42. The shortest distance d2 between the second surface 42 and the light-emitting element 20 is larger than the shortest distance d1 between the first surface 41 and the light-emitting element 20. The first surface 41, the second surface 42, and the third surface 43 are connected as described above, so that a step is formed on the inner lateral surface 16 of the wall portion 12. By providing the step on the inner lateral surface 16 of the wall portion 12, creeping up of the light-reflective member during manufacture of the light-emitting device, particularly creeping up onto the upper surface 12a of the wall portion 12, can be reduced.

The first surface 41 can be substantially perpendicular to the upper surface 15 of the bottom portion 11. Similarly, the second surface 42 can be substantially perpendicular to the upper surface 15 of the bottom portion 11. The expression "substantially perpendicular" as used in the present specification is not limited to strictly 90° but can include angles in the range of about 90°±3°.

The upper end of the first surface 41 and the lower end of the second surface 42 are located at substantially the same height with respect to the upper surface 15 of the bottom portion 11. That is, the third surface 43 connecting the upper end of the first surface 41 and the lower end of the second surface 42 can be substantially parallel to the upper surface 15 of the bottom portion 11. The expression "substantially parallel" as used in the present specification is not limited to strictly parallel but can include the case in which the deviation from parallel is within the range of ±3°.

In the light-emitting device 100 of the first embodiment, the upper end of the second surface 42 corresponds to the inner periphery of the upper surface 12a of the wall portion.

The shortest distance d2 between the second surface 42 and the light-emitting element 20 is larger than the shortest distance d1 between the first surface 41 and the light-emitting element 20 in a cross-sectional view. In other words, the second surface 42 is located outside the first surface 41 in the base member 10 in a cross-sectional view. The difference (that is, shortest distance d2—shortest distance d1) between the shortest distance d2 and the shortest distance d1 is typically equal to the width of the third surface 43.

The shortest distance d1 between the first surface 41 and the light-emitting element 20 is not particularly limited. The shortest distance d1 between the first surface 41 and the light-emitting element 20 can be, for example, 0.2 mm or more, preferably 0.3 mm or more. By setting the shortest distance d1 within the range, the space between the first surface 41 and the light-emitting element 20 is broadened, and the flexibility in the arrangement of the light-reflective member 30 is improved. Accordingly, the space between the light-reflective member 30 and the lateral surfaces of the light-emitting element 20 is broadened, which facilitates extraction of light emitted from the lateral surfaces of the light-emitting element 20 out of the light-emitting device 100 without being reflected by the light-reflective member 30 and entering the light-emitting element 20 again, so that the light extraction efficiency of the light-emitting device 100 can be further enhanced. The shortest distance d1 can be, for example, 2.0 mm or less, preferably 1.0 mm or less. Setting the shortest distance d1 within the range facilitates miniaturization of the light-emitting device 100. In one embodiment, the shortest distance d1 can be 0.2 mm or more and 2.0 mm or less, preferably 0.3 mm or more and 1.0 mm or less, such as 0.6 mm or more and 0.8 mm or less.

The ratio (h0/d1) of a distance h0 between the upper surface 12a of the wall portion and the upper surface 15 of the bottom portion 11 of the base member to the shortest distance d1 between the first surface 41 and the light-emitting element 20 can preferably be 0.5 or more, more preferably 1.0 or more, further preferably 1.2 or more. By setting the ratio of the distance h0 to the shortest distance d1 within the above range, the distance between the inner lateral surface of the wall portion and the light-emitting element is reduced, and miniaturization of the light-emitting device is facilitated. The ratio (h0/d1) of the distance h0 to the shortest distance d1 can preferably be 10.0 or less, more preferably 6.0 or less, further preferably 3.0 or less. Setting the ratio of the distance h0 to the shortest distance d1 within the range facilitates direct extraction of light emitted from the lateral surfaces of the light-emitting element 20 out of the light-emitting device 100 without being reflected by the light-reflective member 30 disposed on the first surface 41, so that the light extraction efficiency of the light-emitting device 100 can be further enhanced. In one embodiment, the ratio (h0/d1) of the distance h0 to the shortest distance d1 can be 0.5 or more and 10.0 or less, preferably 1.0 or more and 6.0 or less, more preferably 1.2 or more and 3.0 or less.

A width w1 of the third surface 43 in a cross-sectional view is not particularly limited. The width w1 of the third surface 43 in a cross-sectional view can be, for example, 0.01 mm or more, preferably 0.02 mm or more. Setting the width w1 of the third surface 43 within the above range can further inhibit creeping up of the light-reflective member 30 onto the upper surface 12a of the wall portion 12 during manufacture. The width w1 of the third surface 43 can be, for example, 0.5 mm or less, preferably 0.1 mm or less. Setting the width w1 of the third surface 43 within the above range can further increase the proportion of the space inside the recess in the light-emitting device 100, so that the flexibility in the arrangement of the light-reflective member 30 is improved. Accordingly, a large space between the light-reflective member 30 and the lateral surfaces of the light-emitting element 20 can be secured, which facilitates extraction of light emitted from the lateral surfaces of the light-emitting element 20 out of the light-emitting device 100 without being reflected by the light-reflective member 30 and entering the light-emitting element 20 again. In one embodiment, the width w1 of the third surface 43 can be 0.01 mm or more and 0.5 mm or less, preferably 0.02 mm or more and 0.1 mm or less.

The shortest distance d2 between the second surface 42 and the light-emitting element 20 can be the sum of the shortest distance d1 and the width w1.

The third surface 43 of the wall portion 12 is located at the same height as the upper surface 24 of the light-emitting element 20 or below the upper surface 24 of the light-emitting element 20 in a cross-sectional view. In other words, a distance h1 between the upper end of the first surface 41 and the upper surface 15 of the bottom portion 11 is equal to a distance h10 between the upper surface 24 of the light-emitting element 20 and the upper surface 15 of the bottom portion 11 or smaller than the distance h10 between the upper surface 24 of the light-emitting element 20 and the upper surface 15 of the bottom portion 11. The third surface 43 of the wall portion 12 is preferably located below the upper surface 24 of the light-emitting element 20. The third surface 43 of the wall portion 12 is provided at the same height as the upper surface 24 of the light-emitting element 20 or below the upper surface 24 of the light-emitting element 20, which facilitates direct emission of light emitted from the light-emitting element 20 and propagating toward a region above the wall portion 12 out of the light-emitting device 100 without being reflected by the light-reflective member 30. That is, a broad and straight optical path is secured between the lateral surfaces of a light-emitting layer of the light-emitting element 20 and the inner edges of the upper surface 12a of the wall portion 12. Accordingly, light emitted from the light-emitting element 20 has a larger proportion of light directly emitted to the region above the light-emitting device 100 without being reflected by the light-reflective member 30, and the light extraction efficiency of the light-emitting device 100 can be enhanced.

The difference between the distance h10 between the upper surface 24 of the light-emitting element 20 and the upper surface 15 of the bottom portion 11 and the distance h1 between the upper end of the first surface 41 and the upper surface 15 of the bottom portion 11 in a cross-sectional view is not particularly limited. The difference between the distance h10 between the upper surface 24 of the light-emitting element 20 and the upper surface 15 of the bottom portion 11 and the distance h1 between the upper end of the first surface 41 and the upper surface 15 of the bottom portion 11 can be, for example, 0.01 mm or more, preferably 0.02 mm or more. By setting the difference between the distance h10 and the distance h1 within the range, the light extraction efficiency of the light-emitting device 100 can be further enhanced. The difference between the distance h10 and the distance h1 can be, for example, 1.0 mm or less, preferably 0.5 mm or less. In one embodiment, the difference between the distance h10 and the distance h1 can be 0.01 mm or more and 1.0 mm or less, preferably 0.02 mm or more and 0.5 mm or less.

The distance h1 between the upper end of the first surface 41 and the upper surface 15 of the bottom portion 11 may be larger than a distance h2 between the upper end of the second surface 42 and the third surface 43 in a cross-sectional view. By causing the distance h1 to be larger than the distance h2, the distance h1 has a larger proportion on the inner lateral surface 16 of the wall portion, and the position of the third surface 43 becomes high. The third surface 43 suppresses creeping up of the light-reflective member 30 onto the upper surface 12a of the wall portion 12 during manufacture of the light-emitting device 100, and the light-reflective member 30 is therefore typically formed up to the vicinity of the inner edges of the third surface 43. Accordingly, in the case where the third surface 43 is provided as in the light-emitting device 100 of the present disclosure, the higher the position of the third surface 43 is, the easier the light-reflective member 30 can be disposed up to a higher position.

The ratio (h1/h2) of the distance h1 between the upper end of the first surface 41 and the upper surface 15 of the bottom portion 11 to the distance h2 between the upper end of the second surface 42 and the third surface 43 in a cross-sectional view can preferably be 1.01 or more, more preferably 1.5 or more, further preferably 3.0 or more. Setting the ratio of the distance h1 to the distance h2 within the range facilitates formation of the light-reflective member 30 up to a higher position. The ratio (h1/h2) of the distance h1 to the distance h2 can preferably be 16.0 or less, more preferably 8.0 or less, further preferably 4.0 or less. Setting the ratio of the distance h1 to the distance h2 within the range increases the distance between the third surface 43 and the upper surface 12a of the wall portion, thereby further inhibiting the light-reflective member 30 from creeping up the upper surface 12a of the wall portion. In one embodiment, the ratio (h1/h2) of the distance h1 to the distance h2 can be 1.01 or more and 16.0 or less, preferably 1.5 or more and 8.0 or less, more preferably 3.0 or more and 4.0 or less.

For example, the base material 13 of the base member 10 can be formed of a single material or a composite material of an insulating material such as glass, a ceramic, a resin, wood, and pulp; or an electroconductive material such as a semiconductor and a metal (e.g., copper, silver, gold, and aluminum). The material of the base material 13 can preferably be a metal, a ceramic, or the like, more preferably a ceramic, which is an inorganic material. Examples of the ceramic include aluminum oxide, aluminum nitride, silicon nitride, and mullite. The ceramic can preferably be aluminum nitride, which has high heat dissipation performance. The bottom portion 11 and the wall portion 12 of the base material 13 may be constituted of the same material or may be constituted of different members.

Figure 3:
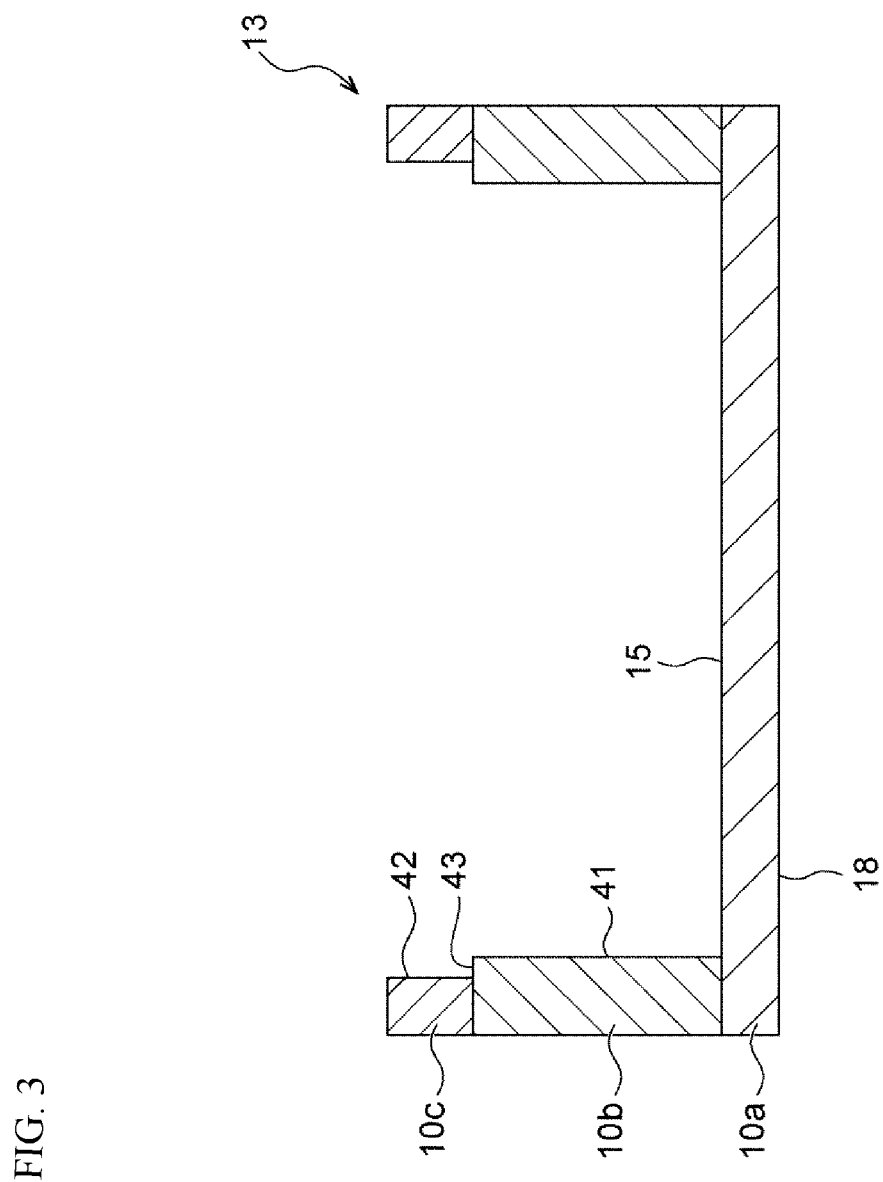
FIG. 3 is a schematic cross-sectional view of a base material 13 of a base member of the light-emitting device 100 according to the first embodiment shown in FIG. 1.

The base material 13 may have a multilayer structure as shown in FIG. 3. For example, the base material 13 may be formed by layering a first layer 10a, a second layer 10b, and a third layer 10c. In such a structure, the first layer 10a can constitute the bottom portion 11, and the second layer 10b and the third layer 10c can constitute the wall portion 12. A portion of the second layer 10b constitutes the first surface 41 and the third surface 43. A portion of the third layer 10c constitutes the second surface 42 and the upper surface 12a of the wall portion. Each layer may further have a multilayer structure constituted of a plurality of layers.

Figure 4:
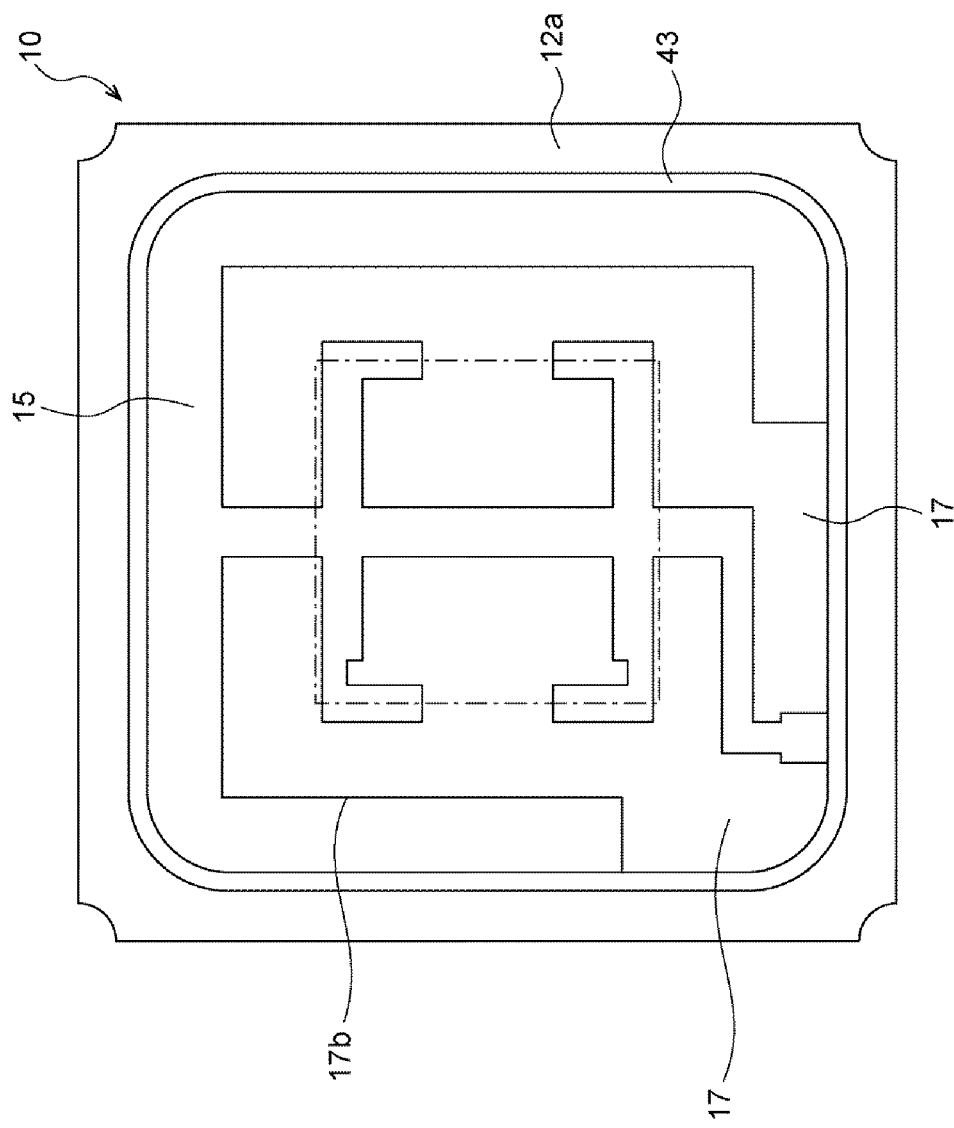
FIG. 4 is a schematic top view of the base member 10 of the light-emitting device 100 according to the first embodiment shown in FIG. 1.

The base member 10 includes the wiring layer 17 and the external electrodes 19. As shown in FIG. 4, the wiring layer 17 is disposed on the upper surface 15 of the bottom portion 11 and electrically connected to electrodes 23 of the light-emitting element 20 described below. The dot-dash line in FIG. 4 indicates the outer edges of the light-emitting element 20 when the light-emitting element 20 is disposed. The wiring layer 17 can have the function of obstructing the flow of the light-reflective member 30 on the upper surface 15 of the bottom portion 11 using the step formed by the thickness. For example, in the example shown in FIG. 4, the wiring layer 17 has an outer edge 17b located between an outer edge of the light-emitting element 20 and the first surface 41 of the wall portion, and the wiring layer 17 can inhibit the light-reflective member 30 from flowing from the first surface 41 side to the light-emitting element 20 side on the upper surface 15 of the bottom portion 11 using the step formed by the outer edge 17b. The external electrodes 19 are disposed on the lower surface 18 of the bottom portion 11. The bottom portion 11 has a through hole, and the wiring layer 17 and the external electrodes 19 are electrically connected via internal wiring disposed inside the through hole. The light-emitting device 100 is electrically connected to an external device via the external electrodes 19.

Light-Emitting Element

Inside the recess 14, the light-emitting element 20 is disposed on the bottom portion 11 of the base member 10. The light-emitting element 20 is preferably disposed at the center of the bottom portion 11 of the base member 10. In the light-emitting device according to certain embodiment(s) of the present disclosure, a plurality of light-emitting elements may be disposed on the bottom portion 11 of the base member 10.

The shape of the light-emitting element 20 shown in FIG. 2 in a top view is rectangular. The shape of the light-emitting element 20 in a top view in the light-emitting device according to certain embodiment(s) of the present disclosure may be any shape. For example, the shape of the light-emitting element 20 in a top view may be a polygon such as a triangle and a hexagon.

As for the rectangular shape formed by the outer edges of the light-emitting element 20 in a top view, two opposite sides are parallel to two opposite sides of the rectangular shape formed by the outer edges of the base member 10. The other two opposite sides of the outer edges of the light-emitting element 20 are parallel to the other two opposite sides of the outer edges of the base member 10. An arrangement is also possible that is provided by, in a state where the outer edges of the light-emitting element 20 and the base member 10 have rectangular shapes and where two opposite sides of the outer edges of the light-emitting element 20 are parallel to two sides of the outer edges of the base member 10 in a top view, rotating the outer edges of the light-emitting element 20 through 45° about the central axis passing through the center of the bottom portion 11 of the base member 10.

The light-emitting element 20 includes a substrate 21 and a semiconductor layer 22. The substrate 21 can be a crystal growth substrate on which a crystal of a semiconductor constituting the semiconductor layer 22 can grow. For example, the substrate 21 is a sapphire substrate or a gallium nitride substrate. For example, the semiconductor layer 22 includes an n-type semiconductor layer, a p-type semiconductor layer, and a light-emitting layer disposed between the n-type semiconductor layer and the p-type semiconductor layer.

As shown in FIG. 1, in the light-emitting device 100 of the first embodiment, two electrodes 23 are disposed on the lower surface of the semiconductor layer 22 and each electrically connected to the wiring layer 17. The two electrodes 23 disposed on the lower surface of the semiconductor layer 22 are what is called a p-electrode and an n-electrode. The p-electrode is electrically connected to the p-type semiconductor layer. The n-electrode is electrically connected to the n-type semiconductor layer.

The semiconductor layer 22 may be a double heterojunction. The light-emitting layer may have a structure such as a single quantum well (SQW) structure or a structure having a plurality of well layers such as a multiple quantum well (MQW) structure. The semiconductor layer 22 is configured to be capable of emitting visible or ultraviolet light. The semiconductor layer 22 including such a light-emitting layer can contain, for example, $In_xAl_yGa_{1-x-y}N$ ($0 \leq x$, $0 \leq y$, and $x+y \leq 1$). The peak wavelength of light emitted from the semiconductor layer 22 is, for example, within the range of 250 nm or more and 630 nm or less.

Light-Reflective Member

The light-reflective member 30 reflects light emitted from the light-emitting element 20. The direction in which light reflected by the light-reflective member 30 is extracted from the light-emitting device 100 is the upward direction of the base member 10.

The light-reflective member 30 is continuously disposed on the upper surface 15 of the bottom portion 11 and the inner lateral surface 16 of the wall portion of the base member 10 along the inner lateral surface 16 of the wall portion 12 of the base member 10.

As shown in FIG. 1, in the light-emitting device 100 of the first embodiment, the light-reflective member 30 is continuously disposed on a portion of the upper surface 15 of the bottom portion 11, the entire first surface 41, the entire third surface 43, and a portion of the second surface 42 so as not to be in contact with the upper end of the second surface 42.

In the light-emitting device according to certain embodiment(s) of the present disclosure, the arrangement of the light-reflective member 30 is not limited to the example shown in FIG. 1. For example, the light-reflective member 30 may be continuously disposed on a portion of the upper surface 15 of the bottom portion 11, the entire first surface 41, and a portion of the third surface 43 but may not be disposed on the second surface 42. The light-reflective member 30 may be continuously disposed on a portion of the upper surface 15 of the bottom portion 11 and the first surface 41 but may not be disposed on the second surface 42 or the third surface 43.

The region of the upper surface 15 of the bottom portion 11 in which the light-reflective member 30 is disposed can be a region up to positions 0.1 mm or more and 1.8 mm or less, preferably 0.3 mm or more and 1.0 mm or less, away from the joint between the upper surface 15 of the bottom portion 11 and the first surface 41 toward the center of the upper surface 15 of the bottom portion 11.

The distance between the upper end of the second surface 42 and the upper end 30a of the light-reflective member 30 can preferably be 0.05 mm or more, more preferably 0.1 mm or more, further preferably 0.15 mm or more. By setting the distance between the upper end of the second surface 42 and the upper end 30a of the light-reflective member 30 within the range, light propagating from the light-emitting element 20 toward the region above the wall portion 12 has an increased amount of light directly emitted out of the light-emitting device without being reflected by the light-reflective member 30, so that the light extraction efficiency of the light-emitting device is enhanced. The distance between the upper end of the second surface 42 and the upper end 30a of the light-reflective member 30 can preferably be 0.5 mm or less, more preferably 0.4 mm or less, further preferably 0.3 mm or less. Setting the distance between the upper end of the second surface 42 and the upper end 30a of the light-reflective member within the range allows the light-reflective member 30 to cover a larger region of the inner lateral surface 16 of the wall portion, so that the light extraction efficiency of the light-emitting device is enhanced.

The light-reflective member 30 can be continuously disposed to surround the light-emitting element 20 in a top view as shown in FIG. 2. Disposing the light-reflective member 30 to surround the light-emitting element 20 allows a larger portion of light emitted from the light-emitting element 20 to be reflected, so that the light extraction efficiency of the light-emitting device is enhanced.

The light-reflective member 30 can preferably be spaced apart from the light-emitting element 20 in a top view. The shortest distance between the light-reflective member 30 and the light-emitting element 20 can preferably be 0.1 mm or more and 1.5 mm or less, preferably 0.2 mm or more and 1.0 mm or less in a top view.

The shortest distance between the surface of the light-reflective member 30 and the light-emitting element 20 can increase from the lower side of the wall portion 12 of the base member 10 toward the upper side of the wall portion 12.

The surface of the light-reflective member 30 can include a curved surface concave toward the outer edge side of the base member 10 in a cross-sectional view. With the concave curved surface of the light-reflective member 30, light emitted from the light-emitting element 20 can be more efficiently reflected upward.

In the light-emitting device according to certain embodiment(s) of the present disclosure, the surface of the light-reflective member is not limited to a surface including a concave curved surface. For example, the surface of the light-reflective member 30 may be a surface that can include a curved surface convex toward the light-emitting element 20 in a cross-sectional view. The surface of the light-reflective member 30 may be straight in a cross-sectional view. As for the light-reflective member 30 having a straight surface, the distance between the surface and the light-emitting element 20 increases at a certain rate from the lower side of the wall portion 12 toward the upper side of the wall portion 12.

The light-reflective member 30 is located below a straight line connecting an upper end P2 of the inner lateral surface 16 of the wall portion 12 and a lower end P1 of a lateral surface of the semiconductor layer 22 of the light-emitting element 20 facing the inner lateral surface 16 of the wall portion 12 in a cross-sectional view. Disposing the light-reflective member 30 below the straight line connecting P1 and P2 allows light emitted from the light-emitting element 20 to have a larger proportion of light directly emitted out of the light-emitting device, so that the light extraction efficiency of the light-emitting device is enhanced.

The light-reflective member 30 is not particularly limited as long as the member has a higher reflectance with respect to light emitted from the light-emitting element 20 than the base material 13 of the base member 10.

For example, the light-reflective member 30 may be a member in which a light-diffusing material is contained in a resin or may be a member containing a plurality of inorganic materials.

Examples of the resin used in the member in which a light-diffusing material is contained in a resin include silicone resins, epoxy resins, and acrylic resins. Examples of the light-diffusing material include titanium oxide, silicon oxide, aluminum oxide, and zinc oxide.

The member in which a plurality of inorganic materials are mixed includes a light-reflective material and a supporting member supporting the light-reflective material.

The light-reflective material can be, for example, boron nitride or aluminum oxide. Boron nitride or aluminum oxide as the light-reflective material can reflect light in the ultraviolet to visible range.

The light-reflective material may be primary particles or may be secondary particles formed by aggregation of two or more primary particles. The light-reflective material may contain primary particles and secondary particles.

The particles of the light-reflective material can preferably be plate-shaped particles.

The average particle diameter of the light-reflective material can preferably be 0.6 μm or more and 43 μm or less. In the case in which the light-reflective material is boron nitride, the average particle diameter of the light-reflective material is, for example, 6 μm or more and 43 μm or less. In the case in which the light-reflective material is aluminum oxide, the average particle diameter of the light-reflective material is, for example, 0.6 µm or more and 10 µm or less.

The average particle diameter of the light-reflective material is calculated using a scanning electron microscope "TM3030Plus" manufactured by Hitachi High-Technologies Corporation.

First, one surface of double-sided tape made of carbon is put on the sample stage of the microscope, and the light-reflective material is then disposed on the other surface of the double-sided tape. The number of pixels of the microscope is set to 1,230,000, the magnification is set to 1,000 to 2,000, and an image of 100 particles of the light-reflective material is acquired. After that, the particle diameter of each particle is measured using image analysis software. In the present specification, the particle diameter of the light-reflective material is the maximum diameter among diameters of the light-reflective material as viewed from one main surface. Subsequently, the median diameter of the measured particles is calculated, and the calculated value is regarded as the average particle diameter of the light-reflective material. The particle diameter of the light-reflective material may be calculated by extracting a cross section of the light-reflective member using the SEM and measuring the particle diameter using the image analysis software.

The supporting member can preferably contain silica and an alkali metal.

The content ratio between silica and the light-reflective material contained in the light-reflective member 30 is, for example, 1:4 to 1:1 in terms of mass ratio. That is, the mass of the light-reflective material contained in the light-reflective member 30 is, for example, once to four times as large as the mass of silica contained in the light-reflective member 30. By setting the content ratio between silica and the light-reflective material to 1:4 to 1:1, shrinkage can be reduced while retaining hardenability during manufacture.

The alkali metal contained in the light-reflective member 30 can be, for example, one or both of potassium and sodium.

The light-reflective member 30 can preferably further contain a scattering material. By incorporating the scattering material in the light-reflective member 30, the light reflectance of the light-reflective member 30 is enhanced.

For example, the scattering material contained in the light-reflective member 30 can be a scattering material containing zirconium oxide or titanium oxide. The scattering material in the light-reflective member 30 is dispersed in silica of the supporting member.

In the case in which the light-emitting element 20 emits ultraviolet light, the scattering material can preferably contain zirconium oxide, which absorbs little light in the ultraviolet wavelength range. Zirconium oxide contained in the scattering material may be zirconium oxide alone or may be zirconium oxide covered with a coating film constituted of any one or two or more of silica, aluminum oxide, zinc, organic substances, and the like. Zirconium oxide contained in the scattering material may be stabilized zirconium oxide or partially stabilized zirconium oxide to which calcium, magnesium, yttrium, aluminum, or the like has been added.

Titanium oxide contained in the scattering material may be titanium oxide alone or may be titanium oxide covered with a coating film constituted of any one or two or more of silica, aluminum oxide, zirconium oxide, zinc, organic substances, and the like.

The average particle diameter of the scattering material is desirably smaller than the average particle diameter of the light-reflective material. When the average particle diameter of the scattering material is smaller than the average particle diameter of the light-reflective material, the scattering material tends to be disposed in the gaps between particles of the light-reflective material, so that light emitted from the light-emitting element 20 can be inhibited from being transmitted through the light-reflective member 30 through the gaps between particles of the light-reflective material. The average particle diameter of the scattering material is measured by laser diffraction.

Light-Transmissive Member

The light-emitting device 100 of the first embodiment includes the light-transmissive member 50 disposed on the base member 10. The light-transmissive member 50 is connected to the base member 10 with the bonding member 51. The light-transmissive member 50 is spaced apart from the light-reflective member 30. The light-transmissive member 50 is not a necessary element of the light-emitting device according to certain embodiment(s) of the present disclosure and may not be included.

The light-transmissive member 50 is a member that transmits light emitted from the light-emitting element 20 and can be a member that preferably transmits 60% or more, more preferably 70% or more, of light emitted from the light-emitting element 20.

The light-transmissive member 50 is a light-transmissive member containing a light-transmissive resin material, an inorganic material, and the like. Examples of the resin material include thermosetting resins such as silicone resins, modified silicone resins, epoxy resins, and phenolic resins and thermoplastic resins such as polycarbonate resins, acrylic resins, methylpentene resins, and polynorbornene resins. Examples of the inorganic material include glass and sapphire.

The light-transmissive member 50 may contain a phosphor.

Examples of the phosphor that can be used include yttrium-aluminum-garnet based phosphors (such as $Y_3(Al,Ga)_5O_{12}:Ce$), lutetium-aluminum-garnet based phosphors (such as $Lu_3(Al,Ga)_5O_{12}:Ce$), terbium-aluminum-garnet based phosphors (such as $Tb_3(Al,Ga)_5O_{12}:Ce$), CCA based phosphors (such as $Ca_{10}(PO_4)_6Cl_2:Eu$), SAE based phosphors (such as $Sr_4Al_{14}O_{25}:Eu$), chlorosilicate based phosphors (such as $Ca_8MgSi_4O_{16}Cl_2:Eu$), nitride based phosphors such as β-SiAlON based phosphors (such as $(Si,Al)_3(O,N)_4:Eu$), α-SiAlON based phosphors (such as $Ca(Si,Al)_{12}(O,N)_{16}:Eu$), SLA based phosphors (such as $SrLiAl_3N_4:Eu$), CASN based phosphors (such as $CaAlSiN_3:Eu$), and SCASN based phosphors (such as $(Sr,Ca)AlSiN_3:Eu$), fluoride based phosphors such as KSF based phosphors (such as $K_2SiF_6:Mn$), KSAF based phosphors (such as $K_2Si_{0.99}Al_{0.01}F_{5.99}:Mn$), and MGF based phosphors (such as $3.5MgO \cdot 0.5MgF_2 \cdot GeO_2:Mn$), phosphors having the perovskite structure (such as $CsPb(F,Cl,Br,I)_3$), and quantum-dot phosphors (such as CdSe, InP, $AgInS_2$, and $AgInSe_2$). For the phosphor added to the light-transmissive member 50, a single type of phosphor or a plurality of types of phosphors may be used.

Examples of the bonding member 51 include adhesives such as solder (such as Au—Sn and Au—In), low-melting-point glass, and resins (such as silicone resins and epoxy resins).

Sealing Member

A sealing member that seals the light-emitting element 20 may be disposed inside the recess 14 of the base member 10 in the light-emitting device. For example, a silicone resin or the like can be used as the base material for the sealing member. The sealing member may contain a phosphor. The sealing member disposed inside the recess 14 can seal members such as the light-reflective member 30 and the wiring layer 17 disposed on the bottom portion 11 of the base member 10.

Second Embodiment

Figure 5:
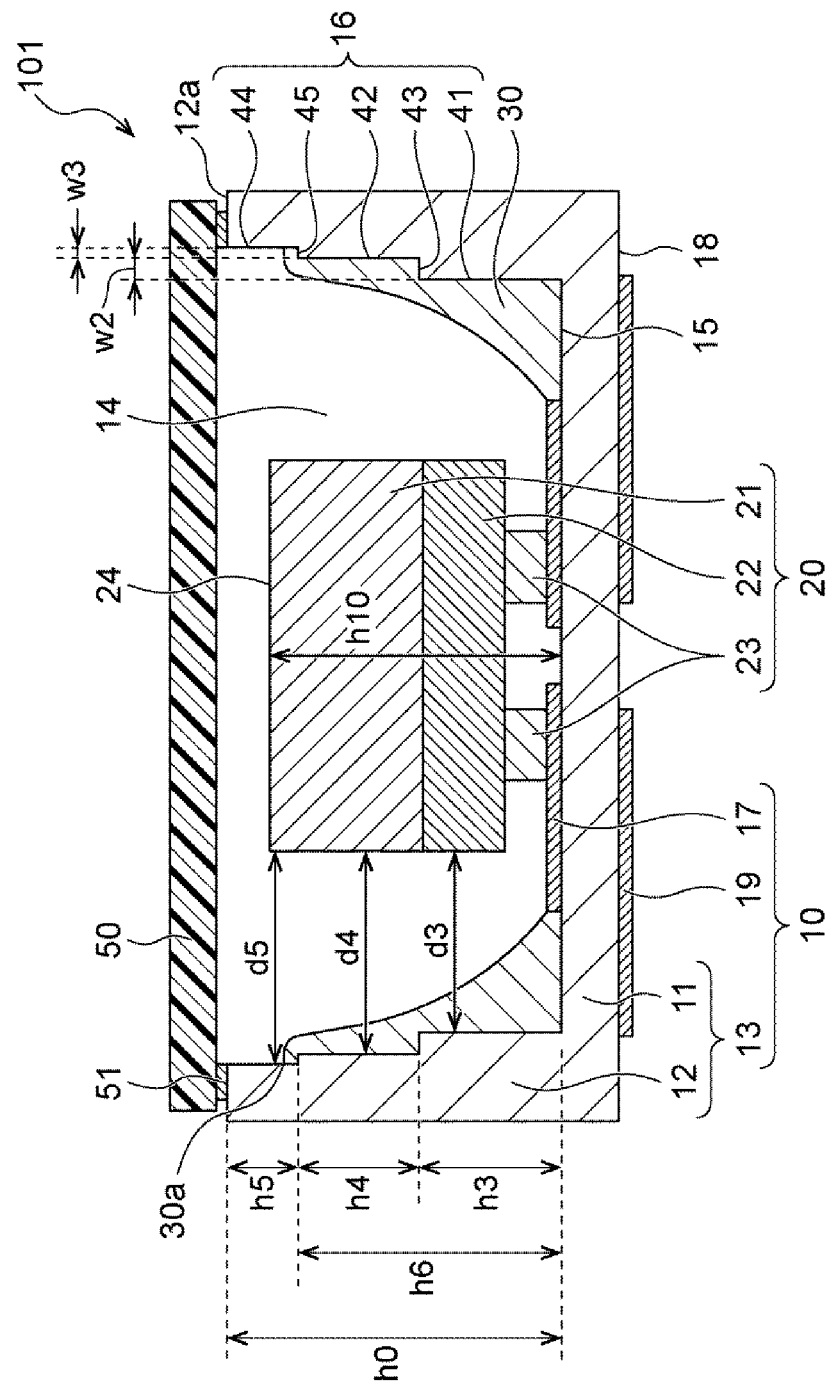
FIG. 5 is a schematic end view of a light-emitting device 101 according to a second embodiment of the present disclosure.
Figure 6:
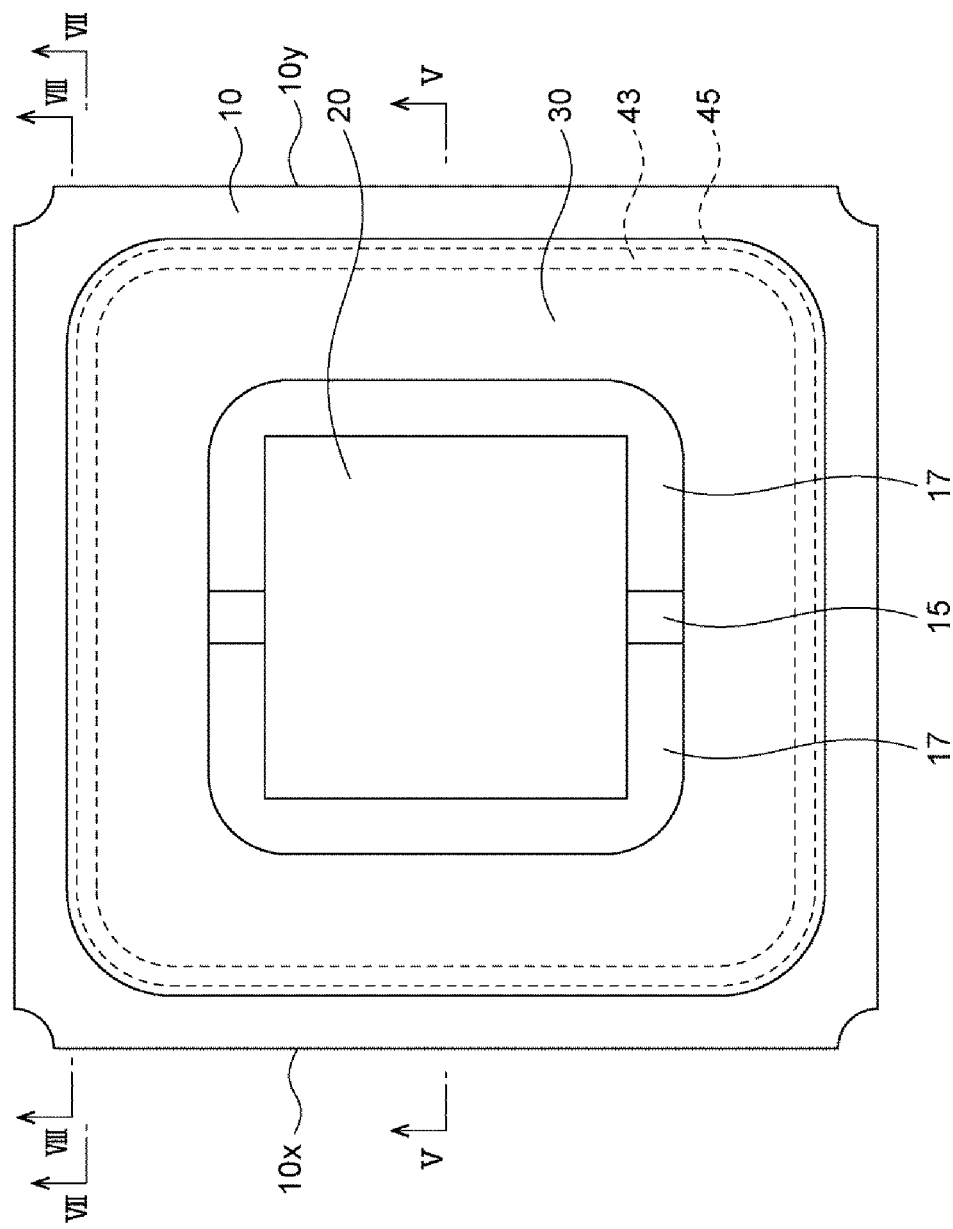
FIG. 6 is a schematic top view of the light-emitting device 101 according to the second embodiment shown in FIG. 5.

A light-emitting device 101 according to a second embodiment of the present disclosure will be described using FIG. 5 and FIG. 6. FIG. 5 is a schematic end view of the light-emitting device 101. FIG. 6 is a schematic top view of the light-emitting device 101. The schematic end view of FIG. 5 shows the light-emitting device 101 cut along the line V-V in the height direction shown in FIG. 6. In FIG. 6, the line V-V passes through the centers of the two lateral surfaces 10x and 10y of the base member 10 facing each other.

The light-emitting device 101 according to the second embodiment of the present disclosure mainly differs from the light-emitting device 100 of the first embodiment in that a fourth surface 44 located above the second surface 42 and a fifth surface 45 connecting the upper end of the second surface 42 and the lower end of the fourth surface 44 are provided and in that a shortest distance d5 between the fourth surface 44 and the light-emitting element 20 is larger than a shortest distance d4 between the second surface 42 and the light-emitting element 20 as shown in FIG. 5 and FIG. 6.

As shown in FIG. 5, the inner lateral surface 16 of the wall portion 12 of the base member 10 of the light-emitting device 101 includes the first surface 41 continuous with the upper surface 15 of the bottom portion 11, the second surface 42 located above the first surface 41, the third surface 43 connecting the upper end of the first surface 41 and the lower end of the second surface 42, the fourth surface 44 located above the second surface 42, and the fifth surface 45 connecting the upper end of the second surface 42 and the lower end of the fourth surface 44 in a cross-sectional view. The shortest distance d4 between the second surface 42 and the light-emitting element 20 is larger than a shortest distance d3 between the first surface 41 and the light-emitting element 20. The shortest distance d5 between the fourth surface 44 and the light-emitting element 20 is larger than the shortest distance d4 between the fourth surface 44 and the light-emitting element 20. The first surface 41, the second surface 42, the third surface 43, the fourth surface 44, and the fifth surface 45 are connected as described above, so that two steps are formed on the inner lateral surface 16 of the wall portion. By providing two steps on the inner lateral surface 16 of the wall portion, the inner lateral surface 16 of the wall portion can be covered with a smaller amount of the light-reflective member 30 than in the case in which the steps are not provided on the inner lateral surface 16 of the wall portion. As with the light-emitting device 100 according to the first embodiment, creeping up of the light-reflective member 30 during manufacture of the light-emitting device, particularly creeping up onto the upper surface 12a of the wall portion, can be reduced.

The first surface 41 can be substantially perpendicular to the upper surface 15 of the bottom portion 11. Similarly, the second surface 42 and the fourth surface 44 can be substantially perpendicular to the upper surface 15 of the bottom portion 11.

The upper end of the first surface 41 and the lower end of the second surface 42 are located at substantially the same height with respect to the upper surface 15 of the bottom portion 11. That is, the third surface 43 connecting the upper end of the first surface 41 and the lower end of the second surface 42 can be substantially parallel to the upper surface 15 of the bottom portion 11. The upper end of the second surface 42 and the lower end of the fourth surface 44 are located at substantially the same height with respect to the upper surface 15 of the bottom portion 11. That is, the fifth surface 45 connecting the upper end of the second surface 42 and the lower end of the fourth surface 44 can be substantially parallel to the upper surface 15 of the bottom portion 11.

In the light-emitting device 101 of the second embodiment, the upper end of the fourth surface 44 corresponds to the inner periphery of the upper surface 12a of the wall portion.

The shortest distance d4 between the second surface 42 and the light-emitting element 20 is larger than the shortest distance d3 between the first surface 41 and the light-emitting element 20 in a cross-sectional view. In other words, the second surface 42 is located outside the first surface 41 in the base member 10 in a cross-sectional view. The difference (that is, shortest distance d4—shortest distance d3) between the shortest distance d4 and the shortest distance d3 is typically equal to a width w2 of the third surface 43.

The shortest distance d5 between the fourth surface 44 and the light-emitting element 20 is larger than the shortest distance d4 between the second surface 42 and the light-emitting element 20 in a cross-sectional view. In other words, the fourth surface 44 is located outside the second surface 42 in the base member 10 in a cross-sectional view. The difference (that is, shortest distance d5—shortest distance d4) between the shortest distance d5 and the shortest distance d4 is typically equal to a width w3 of the fifth surface 45.

The shortest distance d3 between the first surface 41 and the light-emitting element 20 is not particularly limited but can preferably be 0.2 mm or more, more preferably 0.3 mm or more. By setting the shortest distance d3 within the range, the space between the first surface 41 and the light-emitting element 20 is broadened, and the flexibility in the arrangement of the light-reflective member 30 is improved. Accordingly, the space between the light-reflective member 30 and the lateral surfaces of the light-emitting element 20 is broadened, which facilitates extraction of light emitted from the lateral surfaces of the light-emitting element 20 out of the light-emitting device 101 without being reflected by the light-reflective member 30 and entering the light-emitting element 20 again, so that the light extraction efficiency of the light-emitting device 101 can be further enhanced. The shortest distance d3 is not particularly limited but can preferably be 2.0 mm or less, more preferably 1.0 mm or less. Setting the shortest distance d3 within the range facilitates miniaturization of the light-emitting device 101. In one embodiment, the distance d3 can be 0.2 mm or more and 2.0 mm or less, preferably 0.3 mm or more and 1.0 mm or less, such as 0.6 mm or more and 0.8 mm or less.

The ratio (h0/d3) of the distance h0 between the upper surface 12a of the wall portion and the upper surface 15 of the bottom portion 11 of the base member to the shortest distance d3 between the first surface 41 and the light-emitting element 20 can preferably be 0.5 or more, more preferably 1.0 or more, further preferably 1.2 or more. By setting the ratio of the distance h0 to the shortest distance d1 within the above range, the distance between the inner lateral surface 16 of the wall portion 11 and the light-emitting element 20 is reduced, and miniaturization of the light-emitting device 101 is facilitated. The ratio (h0/d3) of the distance h0 to the shortest distance d3 can preferably be 10.0 or less, more preferably 6.0 or less, further preferably 3.0 or less. Setting the ratio of the distance h0 to the shortest distance d3 to 10.0 or less facilitates extraction of light emitted from the lateral surfaces of the light-emitting element 20 out of the light-emitting device 101 without being reflected by the light-reflective member 30 disposed on the first surface 41, so that the light extraction efficiency of the light-emitting device 101 can be further enhanced. In one embodiment, the ratio (h0/d3) of the distance h0 to the shortest distance d1 can be 0.5 or more and 10.0 or less, preferably 1.0 or more and 6.0 or less, more preferably 1.2 or more and 3.0 or less.

The width w2 of the third surface 43 in a cross-sectional view is not particularly limited but can preferably be 0.01 mm or more, more preferably 0.05 mm or more. Setting the width w2 of the third surface 43 within the above range can further inhibit creeping up of the light-reflective member during manufacture. The width w2 of the third surface 43 is not particularly limited but can preferably be 2.0 mm or less, more preferably 1.0 mm or less. Setting the width w2 of the third surface 43 within the above range can further increase the proportion of the space inside the recess in the light-emitting device 101, so that the flexibility in the arrangement of the light-reflective member 30 is improved. Accordingly, a large space between the light-reflective member 30 and the lateral surfaces of the light-emitting element 20 can be secured, which facilitates extraction of light emitted from the lateral surfaces of the light-emitting element 20 out of the light-emitting device 101 without being reflected by the light-reflective member 30 and entering the light-emitting element 20 again. In one embodiment, the width w2 of the third surface 43 can be 0.01 mm or more and 2.0 mm or less, preferably 0.05 mm or more and 1.0 mm or less.

The width w3 of the fifth surface 45 in a cross-sectional view is not particularly limited but can preferably be 0.01 mm or more, more preferably 0.02 mm or more. Setting the width w3 of the fifth surface 45 within the above range can further inhibit creeping up of the light-reflective member during manufacture. The width w3 of the fifth surface 45 is not particularly limited but can preferably be 2.0 mm or less, more preferably 1.0 mm or less. Setting the width w3 of the fifth surface 45 within the above range can further increase the proportion of the space inside the recess in the light-emitting device 101, so that the flexibility in the arrangement of the light-reflective member 30 is improved. Accordingly, a large space between the light-reflective member 30 and the lateral surfaces of the light-emitting element 20 can be secured, which facilitates extraction of light emitted from the lateral surfaces of the light-emitting element 20 out of the light-emitting device 101 without being reflected by the light-reflective member 30 and entering the light-emitting element 20 again. In one embodiment, the width w3 of the fifth surface 45 can be 0.01 mm or more and 2.0 mm or less, preferably 0.02 mm or more and 1.0 mm or less.

The width w2 of the third surface 43 may be larger than the width w3 of the fifth surface 45 in a cross-sectional view. For example, in any cross section that is perpendicular to the upper surface 15 of the bottom portion 11 and passes through the center of the upper surface 15 of the bottom portion 11, the width w2 of the third surface 43 is larger than the width w3 of the fifth surface 45. By causing the width w2 of the third surface 43 to be larger than the width w3 of the fifth surface 45, the first surface 41 can be covered with a smaller amount of the light-reflective member 30 than in the case in which the steps are not provided on the inner lateral surface 16 of the wall portion 12. Accordingly, it becomes easy to adjust the inclination of the surface of the light-reflective member 30 while reducing the amount of the light-reflective member 30 used during manufacture.

The ratio (w2/w3) of the width w2 of the third surface 43 to the width w3 of the fifth surface 45 can preferably be 0.1 or more, more preferably 0.2 or more, further preferably 0.3 or more. The ratio (w2/w3) of the width w2 of the third surface 43 to the width w3 of the fifth surface 45 can preferably be 10.0 or less, more preferably 8.0 or less, further preferably 6.0 or less. In one embodiment, the ratio (w2/w3) of the width w2 of the third surface 43 to the width w3 of the fifth surface 45 can be 0.1 or more and 10.0 or less, preferably 0.2 or more and 8.0 or less, more preferably 0.3 or more and 6.0 or less.

The shortest distance d4 between the second surface 42 and the light-emitting element 20 can be the sum of the shortest distance d3 and the width w2 of the third surface 43. The shortest distance d5 between the fourth surface 44 and the light-emitting element 20 can be the sum of the shortest distance d4 and the width w3 of the fifth surface 45.

The fifth surface 45 of the wall portion 12 is located at the same height as the upper surface 24 of the light-emitting element 20 or below the upper surface 24 of the light-emitting element 20 in a cross-sectional view. In other words, a distance h6 between the upper end of the second surface 42 and the upper surface 15 of the bottom portion 11 is equal to the distance h10 between the upper surface 24 of the light-emitting element 20 and the upper surface 15 of the bottom portion 11 or smaller than the distance h10 between the upper surface 24 of the light-emitting element 20 and the upper surface 15 of the bottom portion 11. The fifth surface 45 of the wall portion 12 is preferably located below the upper surface 24 of the light-emitting element 20. The fifth surface 45 of the wall portion 12 is provided at the same height as the upper surface 24 of the light-emitting element 20 or below the upper surface 24 of the light-emitting element 20, which facilitates direct emission of light emitted from the light-emitting element 20 and propagating toward a region above the wall portion 12 out of the light-emitting device 101 without being reflected by the light-reflective member 30. That is, a broad and straight optical path is secured between the lateral surfaces of the light-emitting layer of the light-emitting element 20 and the inner edges of the upper surface 12a of the wall portion 12. Accordingly, light emitted from the light-emitting element 20 has a larger proportion of light directly emitted to the region above the light-emitting device 101 without being reflected by the light-reflective member 30, and the light extraction efficiency of the light-emitting device 101 can be enhanced.

The difference between the distance h10 between the upper surface 24 of the light-emitting element 20 and the upper surface 15 of the bottom portion 11 and the distance h6 between the upper end of the second surface 42 and the upper surface 15 of the bottom portion 11 in a cross-sectional view is not particularly limited. The difference between the distance h10 between the upper surface 24 of the light-emitting element 20 and the upper surface 15 of the bottom portion 11 and the distance h6 between the upper end of the second surface 42 and the upper surface 15 of the bottom portion 11 can be, for example, 0.01 mm or more, preferably 0.02 mm or more. By setting the difference between the distance h10 and the distance h6 within the range, the light extraction efficiency of the light-emitting device 101 can be further enhanced. The difference between the distance h10 and the distance h6 is not particularly limited but can preferably be 1.0 mm or less, more preferably 0.5 mm or less. In one embodiment, the difference between the distance h10 and the distance h6 can be 0.01 mm or more and 1.0 mm or less, preferably 0.02 mm or more and 0.5 mm or less.

A distance h3 between the upper end of the first surface 41 and the upper surface 15 of the bottom portion 11 may be larger than a distance h4 between the upper end of the second surface 42 and the third surface 43 in a cross-sectional view. By causing the distance h3 to be larger than the distance h4, the distance h3 has a larger proportion on the inner lateral surface 16 of the wall portion, and the position of the third surface 43 becomes high, so that creeping up of the light-reflective member 30 can be reduced at a higher position. Accordingly, the light-reflective member 30 can be formed up to a higher position.

The ratio (h3/h4) of the distance h3 between the upper end of the first surface 41 and the upper surface 15 of the bottom portion 11 to the distance h4 between the upper end of the second surface 42 and the third surface 43 in a cross-sectional view can preferably be 0.5 or more, more preferably 0.7 or more, further preferably 0.9 or more. Increasing the ratio of the distance h3 to the distance h4 facilitates formation of the light-reflective member up to a higher position. The ratio (h3/h4) of the distance h3 to the distance h4 can preferably be 1.5 or less, more preferably 1.3 or less, further preferably 1.1 or less. Reducing the ratio of the distance h3 to the distance h4 increases the distance between the third surface 43 and the upper surface 12a of the wall portion, thereby further inhibiting the light-reflective member from creeping up the upper surface 12a of the wall portion. In one embodiment, the ratio (h3/h4) of the distance h3 to the distance h4 can be 0.5 or more and 1.5 or less, preferably 0.7 or more and 1.3 or less, more preferably 0.9 or more and 1.1 or less.

The distance h4 between the upper end of the second surface 42 and the third surface 43 may be larger than a distance h5 between the upper end of the fourth surface 44 and the fifth surface 45 in a cross-sectional view. By causing the distance h4 to be larger than the distance h5, the position of the fifth surface 45 becomes high. The fifth surface 45 suppresses creeping up of the light-reflective member 30 onto the upper surface 12a of the wall portion 12 during manufacture of the light-emitting device, and the light-reflective member 30 is therefore typically formed up to the vicinity of the inner edges of the fifth surface 45. Accordingly, in the case in which the fifth surface 45 is provided, the higher the position of the fifth surface 45 is, the easier the light-reflective member 30 can be formed up to a higher position.

The ratio (h4/h5) of the distance h4 between the upper end of the second surface 42 and the third surface 43 to the distance h5 between the upper end of the fourth surface 44 and the fifth surface 45 in a cross-sectional view can preferably be 1.01 or more, more preferably 1.2 or more, further preferably 1.5 or more. Setting the ratio of the distance h4 to the distance h5 within the range facilitates formation of the light-reflective member up to a higher position. The ratio (h4/h5) of the distance h4 to the distance h5 can preferably be 5.0 or less, more preferably 3.0 or less, further preferably 2.0 or less. Setting the ratio of the distance h4 to the distance h5 within the range increases the distance between the fifth surface 45 and the upper surface 12a of the wall portion, thereby further inhibiting the light-reflective member 30 from creeping up the upper surface 12a of the wall portion. In one embodiment, the ratio (h4/h5) of the distance h4 to the distance h5 can be 1.01 or more and 5.0 or less, preferably 1.2 or more and 3.0 or less, more preferably 1.5 or more and 2.0 or less.

As with the base material 13 of the base member in the light-emitting device 100 according to the first embodiment, the base material 13 of the base member in the light-emitting device 101 according to the second embodiment may have a multilayer structure. For example, the base material 13 may be formed by layering a first layer, a second layer, a third layer, and a fourth layer. In this embodiment, the first layer can constitute the bottom portion 11, and the second layer, the third layer, and the fourth layer can constitute the wall portion 12. A portion of the second layer constitutes the first surface 41 and the third surface 43. A portion of the third layer constitutes the second surface 42 and the fifth surface 45. A portion of the fourth layer constitutes the fourth surface 44 and the upper surface 12a of the wall portion. Each layer may further have a multilayer structure constituted of a plurality of layers.

As shown in FIG. 5, in the light-emitting device 101 of the second embodiment, the light-reflective member 30 is continuously disposed on a portion of the upper surface 15 of the bottom portion 11, the entire first surface 41, the entire third surface 43, the entire second surface 42, the entire fifth surface 45, and a portion of the fourth surface 44 so as not to be in contact with the upper end of the fourth surface 44.

In the light-emitting device according to certain embodiment(s) of the present disclosure, the arrangement of the light-reflective member 30 is not limited to the example shown in FIG. 5. For example, the light-reflective member 30 may be continuously disposed on a portion of the upper surface 15 of the bottom portion 11, the entire first surface 41, the entire third surface 43, the entire second surface 42, and a portion of the fifth surface 45 but may not be disposed on the fourth surface 44. The light-reflective member 30 may be continuously disposed on a portion of the upper surface 15 of the bottom portion, the entire first surface 41, the entire third surface 43, and the second surface 42 but may not be disposed on the fifth surface 45 or the fourth surface 44.

The distance between the upper end of the fourth surface 44 and the upper end 30a of the light-reflective member 30 can preferably be 0.05 mm or more, more preferably 0.1 mm or more, further preferably 0.15 mm or more. By setting the distance within the range, light propagating from the light-emitting element 20 toward the region above the wall portion 12 has an increased amount of light directly emitted out of the light-emitting device 101 without being reflected by the light-reflective member 30, so that the light extraction efficiency of the light-emitting device 101 is enhanced. The distance between the upper end of the fourth surface 44 and the upper end 30a of the light-reflective member 30 can preferably be 0.5 mm or less, more preferably 0.4 mm or less, further preferably 0.3 mm or less. Setting the distance within the range allows the light-reflective member 30 to cover a larger region of the inner lateral surface 16 of the wall portion, so that the light extraction efficiency of the light-emitting device is enhanced.

Modified examples of the light-emitting devices of the first embodiment and the second embodiment of the present disclosure will be described below.

Modified Example 1

Figure 7:
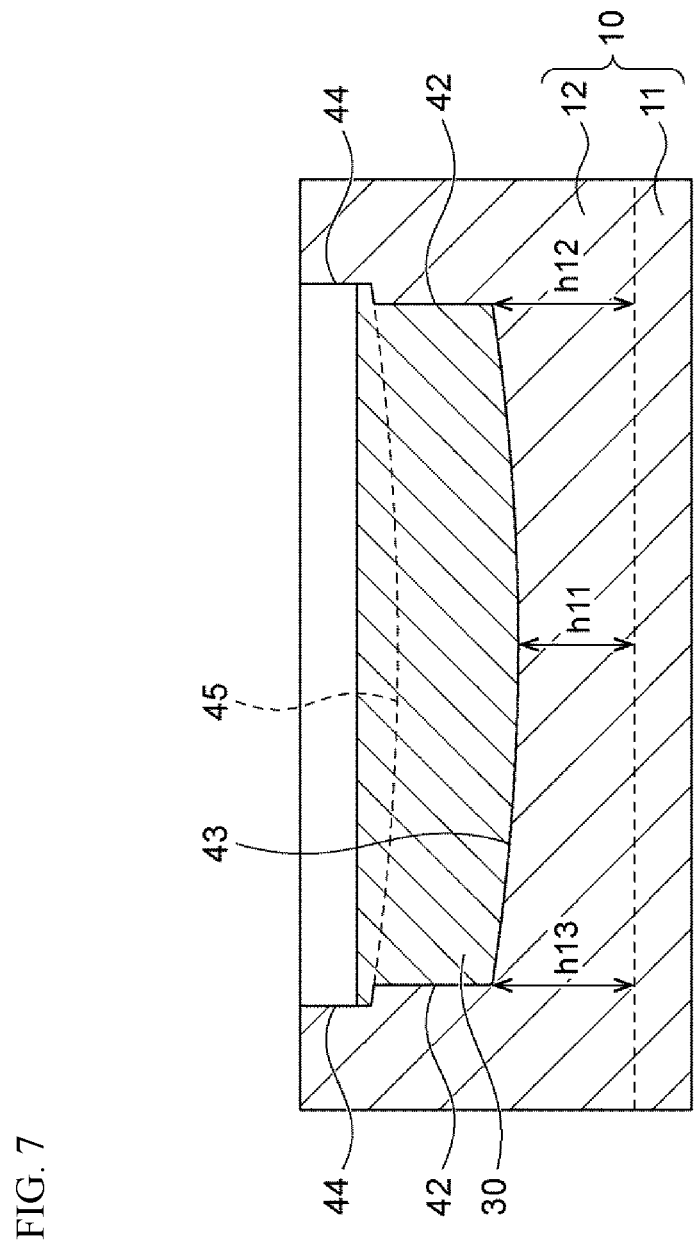
FIG. 7 is a schematic cross-sectional view of the light-emitting device 101 according to the second embodiment taken along the line VII-VII in FIG. 6.

FIG. 7 is a schematic cross-sectional view of the light-emitting device cut along the line VII-VII of FIG. 6. As shown in FIG. 6, in the light-emitting device of Modified Example 1, the third surface 43 has a substantially rectangular outer shape in a top view. As shown in FIG. 7, in the light-emitting device of Modified Example 1, a distance h11 between the third surface 43 and the upper surface 15 of the bottom portion at the center of each side of the third surface 43 is smaller than distances h12 and h13 between the third surface 43 and the upper surface 15 of the bottom portion at the ends of each side of the third surface 43 in a cross-sectional view.

Figure 8:
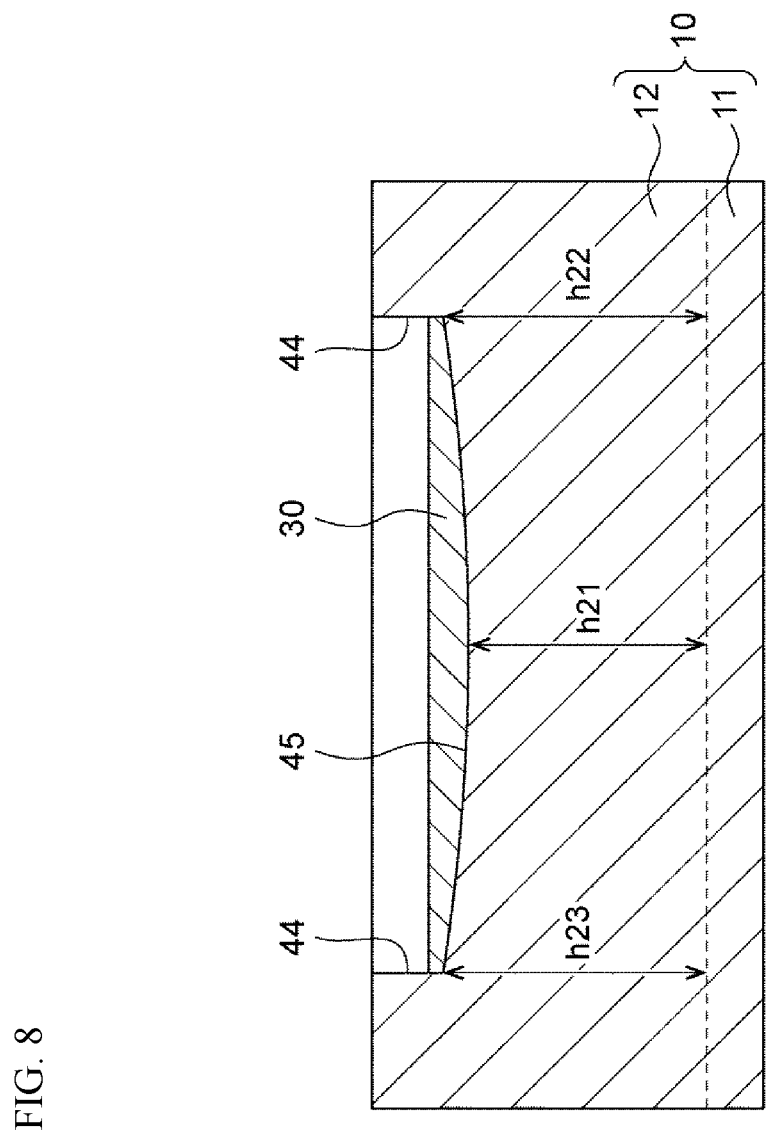
FIG. 8 is a schematic cross-sectional view of the light-emitting device 101 according to the second embodiment taken along the line VIII-VIII in FIG. 6.

FIG. 8 is a schematic cross-sectional view of the light-emitting device cut along the line VIII-VIII of FIG. 6. As shown in FIG. 6, in the light-emitting device of Modified Example 1, the fifth surface 45 has a substantially rectangular outer shape in a top view, and as shown in FIG. 8, a distance h21 between the fifth surface 45 and the upper surface 15 of the bottom portion at the center of each side of the fifth surface 45 is smaller than distances h22 and h23 between the fifth surface 45 and the upper surface 15 of the bottom portion at the ends of each side of the third surface 45 in a cross-sectional view.

In Modified Example 1 of the second embodiment, both or only one of the height of the third surface and the height of the fifth surface may satisfy the above requirements.

Modified Example 2

In a light-emitting device of Modified Example 2, the third surface 43 has a substantially rectangular outer shape in a top view. In the light-emitting device of Modified Example 2, the light-reflective member 30 is disposed on the third surface 43, and the thickness of the light-reflective member 30 on the third surface 43 at the center of each side of the third surface 43 is larger than the thickness of the light-reflective member 30 on the third surface 43 at an end of each side of the third surface 43.

In the light-emitting device of Modified Example 2, the fifth surface 45 has a substantially rectangular outer shape in a top view. In the light-emitting device of Modified Example 2, the light-reflective member 30 is disposed on the fifth surface 45, the thickness of the light-reflective member 30 on the fifth surface 45 at the center of each side of the fifth surface 45 is larger than the thickness of the light-reflective member 30 on the third surface 43 at an end of each side of the fifth surface 45.

In Modified Example 2 of the second embodiment, both or only one of the thickness of the light-reflective member 30 on the third surface 43 and the thickness of the light-reflective member 30 on the fifth surface 45 may satisfy the above requirements.

Modified Example 1 and Modified Example 2 are preferably combined. For example, the distance h11 between the third surface 43 and the upper surface 15 of the bottom portion at the center of each side of the third surface 43 is smaller than the distances h12 and h13 between the third surface 43 and the upper surface 15 of the bottom portion at the ends of each side of the third surface 43 in a cross-sectional view. The light-reflective member 30 is disposed on the third surface 43, and the thickness of the light-reflective member 30 on the third surface 43 at the center of each side of the third surface 43 is larger than the thickness of the light-reflective member 30 on the third surface 43 at an end of each side of the third surface 43. The fifth surface 45 has a substantially rectangular outer shape in a top view, and the distance h21 between the fifth surface 45 and the upper surface 15 of the bottom portion at the center of each side of the fifth surface 45 is smaller than the distances h22 and h23 between the fifth surface 45 and the upper surface 15 of the bottom portion at the ends of each side of the fifth surface 45 in a cross-sectional view. The light-reflective member 30 is disposed on the fifth surface 45, and the thickness of the light-reflective member 30 on the fifth surface 45 at the center of each side of the fifth surface 45 is larger than the thickness of the light-reflective member 30 on the fifth surface 45 at an end of each side of the fifth surface 45.

The present specification includes the following embodiments.

1. A light-emitting device including:
   a base member having a recess defined by a bottom portion and a wall portion located above the bottom portion;
   a light-emitting element disposed in the recess; and
   a light-reflective member continuously disposed on an upper surface of the bottom portion and an inner lateral surface of the wall portion in the recess of the base member,
   in which, in a cross-sectional view,
   the inner lateral surface of the wall portion includes a first surface continuous with the upper surface of the bottom portion, a second surface located above the first surface, and a third surface connecting an upper end of the first surface and a lower end of the second surface,
   a shortest distance between the second surface and the light-emitting element is larger than a shortest distance between the first surface and the light-emitting element,
   the third surface is located at the same height as an upper surface of the light-emitting element or below the upper surface of the light-emitting element, and
   an upper end of the light-reflective member is located below an upper surface of the wall portion.

2. The light-emitting device according to item 1 above, in which a distance between the upper end of the first surface and the upper surface of the bottom portion is larger than a distance between an upper end of the second surface and the third surface.

3. The light-emitting device according to item 1 or 2 above, in which the light-reflective member is disposed on the upper surface of the bottom portion, the first surface, the third surface, and the second surface so as not to be in contact with an upper end of the second surface.

4. The light-emitting device according to any one of items 1 to 3 above, in which
   the inner lateral surface of the wall portion further includes a fourth surface located above the second surface and a fifth surface connecting an upper end of the second surface and a lower end of the fourth surface, and
   a shortest distance between the fourth surface and the light-emitting element is larger than the shortest distance between the second surface and the light-emitting element.

5. The light-emitting device according to item 4 above, in which
   the third surface is located below the upper surface of the light-emitting element, and
   the fifth surface is located at the same height as the upper surface of the light-emitting element or below the upper surface of the light-emitting element.

6. The light-emitting device according to item 4 or 5 above, in which a distance between the upper end of the second surface and the third surface is larger than a distance between an upper end of the fourth surface and the fifth surface.

7. The light-emitting device according to any one of items 4 to 6 above, in which, in any cross section being perpendicular to the upper surface of the bottom portion and passing through a center of the upper surface of the bottom portion, a width of the third surface is larger than a width of the fifth surface.

8. The light-emitting device according to any one of items 4 to 7 above, in which the light-reflective member is disposed on the upper surface of the bottom portion, the first surface, the third surface, the second surface, the fifth surface, and the fourth surface so as not to be in contact with an upper end of the fourth surface.

9. The light-emitting device according to any one of items 1 to 8 above, in which
   the third surface has a substantially rectangular outer shape in a top view, and
   a distance between the third surface and the upper surface of the bottom portion at a center of each side of the third surface is smaller than a distance between the third surface and the upper surface of the bottom portion at an end of each side of the third surface in a cross-sectional view.

10. The light-emitting device according to item 9 above, in which
    the light-reflective member is disposed on the third surface, and
    a thickness of the light-reflective member on the third surface at a center of each side of the third surface is larger than a thickness of the light-reflective member on the third surface at an end of each side of the third surface.

11. The light-emitting device according to item 8 above, in which
    the fifth surface has a substantially rectangular outer shape in a top view, and
    a distance between the fifth surface and the upper surface of the bottom portion at a center of each side of the fifth surface is smaller than a distance between the fifth surface and the upper surface of the bottom portion at an end of each side of the fifth surface in a cross-sectional view.

12. The light-emitting device according to item 11 above, in which
    the light-reflective member is disposed on the fifth surface, and
    a thickness of the light-reflective member on the fifth surface at a center of each side of the fifth surface is larger than a thickness of the light-reflective member on the third surface at an end of each side of the fifth surface.

13. The light-emitting device according to any one of items 1 to 12 above, in which a distance between a surface of the light-reflective member and the light-emitting element increases from a lower side of the wall portion to an upper side of the wall portion.

14. The light-emitting device according to any one of items 1 to 13 above, in which
    the light-emitting element includes a substrate and a semiconductor layer located below the substrate, and
    the light-reflective member is located below a straight line connecting an upper end of the inner lateral surface of the wall portion and a lower end of a lateral surface of the semiconductor layer of the light-emitting element facing the inner lateral surface of the wall portion in a cross-sectional view.

15. The light-emitting device according to any one of items 1 to 14 above, in which the light-reflective member is spaced apart from the light-emitting element in a top view.

16. The light-emitting device according to any one of items 1 to 15 above, further including a light-transmissive member disposed on the base member,
    in which the light-transmissive member is spaced apart from the light-reflective member.

What is claimed is:
1. A light-emitting device comprising:
   a base member having a recess defined by a bottom portion and a wall portion located above the bottom portion;
   a light-emitting element disposed in the recess; and
   a light-reflective member continuously disposed on an upper surface of the bottom portion and at least a portion of an inner lateral surface of the wall portion in the recess of the base member,
   wherein, in a cross-sectional view,
   the inner lateral surface of the wall portion comprises a first surface continuous with the upper surface of the bottom portion, a second surface located above the first surface, and a third surface connecting an upper end of the first surface and a lower end of the second surface,
   wherein a shortest distance between the second surface and the light-emitting element is larger than a shortest distance between the first surface and the light-emitting element,
   wherein the third surface is located at the same height as an upper surface of the light-emitting element or below the upper surface of the light-emitting element,
   wherein an upper end of the light-reflective member is located below an upper surface of the wall portion,
   wherein the inner lateral surface of the wall portion further comprises a fourth surface located above the second surface and a fifth surface connecting an upper end of the second surface and a lower end of the fourth surface,
   wherein a shortest distance between the fourth surface and the light-emitting element is larger than the shortest distance between the second surface and the light-emitting element, and
   wherein, in any cross section being perpendicular to the upper surface of the bottom portion and passing through a center of the upper surface of the bottom portion, a width of the third surface is larger than a width of the fifth surface.

2. The light-emitting device according to claim 1, wherein the light-reflective member is disposed on the upper surface of the bottom portion, the first surface, the third surface, the second surface, the fifth surface, and the fourth surface so as not to be in contact with an upper end of the fourth surface.

3. A light-emitting device comprising:
   a base member having a recess defined by a bottom portion and a wall portion located above the bottom portion;
   a light-emitting element disposed in the recess; and
   a light-reflective member continuously disposed on an upper surface of the bottom portion and at least a portion of an inner lateral surface of the wall portion in the recess of the base member,
   wherein, in a cross-sectional view,
   the inner lateral surface of the wall portion comprises a first surface continuous with the upper surface of the bottom portion, a second surface located above the first surface, and a third surface connecting an upper end of the first surface and a lower end of the second surface, wherein a shortest distance between the second surface and the light-emitting element is larger than a shortest distance between the first surface and the light-emitting element, wherein the third surface is located at the same height as an upper surface of the light-emitting element or below the upper surface of the light-emitting element, wherein an upper end of the light-reflective member is located below an upper surface of the wall portion, wherein the third surface has a substantially rectangular outer shape in a top view, and wherein a distance between the third surface and the upper surface of the bottom portion at a center of each side of the third surface is smaller than a distance between the third surface and the upper surface of the bottom portion at an end of each side of the third surface in a cross-sectional view.

4. The light-emitting device according to claim 3, wherein the light-reflective member is disposed on the third surface, and wherein a thickness of the light-reflective member on the third surface at a center of each side of the third surface is larger than a thickness of the light-reflective member on the third surface at an end of each side of the third surface.

5. A light-emitting device comprising:

a base member having a recess defined by a bottom portion and a wall portion located above the bottom portion;

a light-emitting element disposed in the recess; and a light-reflective member continuously disposed on an upper surface of the bottom portion and at least a portion of an inner lateral surface of the wall portion in the recess of the base member, wherein, in a cross-sectional view, the inner lateral surface of the wall portion comprises a first surface continuous with the upper surface of the bottom portion, a second surface located above the first surface, and a third surface connecting an upper end of the first surface and a lower end of the second surface, wherein a shortest distance between the second surface and the light-emitting element is larger than a shortest distance between the first surface and the light-emitting element, wherein the third surface is located at the same height as an upper surface of the light-emitting element or below the upper surface of the light-emitting element, wherein an upper end of the light-reflective member is located below an upper surface of the wall portion, wherein the inner lateral surface of the wall portion further comprises a fourth surface located above the second surface and a fifth surface connecting an upper end of the second surface and a lower end of the fourth surface, wherein a shortest distance between the fourth surface and the light-emitting element is larger than the shortest distance between the second surface and the light-emitting element, wherein the light-reflective member is disposed on the upper surface of the bottom portion, the first surface, the third surface, the second surface, the fifth surface, and the fourth surface so as not to be in contact with an upper end of the fourth surface, and wherein the fifth surface has a substantially rectangular outer shape in a top view, and wherein a distance between the fifth surface and the upper surface of the bottom portion at a center of each side of the fifth surface is smaller than a distance between the fifth surface and the upper surface of the bottom portion at an end of each side of the fifth surface in a cross-sectional view.

6. The light-emitting device according to claim 5, wherein the light-reflective member is disposed on the fifth surface, and wherein a thickness of the light-reflective member on the fifth surface at a center of each side of the fifth surface is larger than a thickness of the light-reflective member on the third surface at an end of each side of the fifth surface.

7. The light-emitting device according to claim 1, wherein a distance between a surface of the light-reflective member and the light-emitting element increases from a lower side of the wall portion to an upper side of the wall portion.

8. A light-emitting device comprising:

a base member having a recess defined by a bottom portion and a wall portion located above the bottom portion;

a light-emitting element disposed in the recess; and a light-reflective member continuously disposed on an upper surface of the bottom portion and at least a portion of an inner lateral surface of the wall portion in the recess of the base member, wherein, in a cross-sectional view, the inner lateral surface of the wall portion comprises a first surface continuous with the upper surface of the bottom portion, a second surface located above the first surface, and a third surface connecting an upper end of the first surface and a lower end of the second surface, wherein a shortest distance between the second surface and the light-emitting element is larger than a shortest distance between the first surface and the light-emitting element, wherein the third surface is located at the same height as an upper surface of the light-emitting element or below the upper surface of the light-emitting element, wherein an upper end of the light-reflective member is located below an upper surface of the wall portion, wherein the light-emitting element comprises a substrate and a semiconductor layer located below the substrate, and wherein the light-reflective member is located below a straight line connecting an upper end of the inner lateral surface of the wall portion and a lower end of a lateral surface of the semiconductor layer of the light-emitting element facing the inner lateral surface of the wall portion in a cross-sectional view.

9. The light-emitting device according to claim 1, wherein the light-reflective member is spaced apart from the light-emitting element in a top view.

10. The light-emitting device according to claim 1, further comprising a light-transmissive member disposed on the base member, wherein the light-transmissive member is spaced apart from the light-reflective member.

11. The light-emitting device according to claim 1, wherein the third surface is located below the upper surface of the light-emitting element, and wherein the fifth surface is located at the same height as the upper surface of the light-emitting element or below the upper surface of the light-emitting element.

12. The light-emitting device according to claim 1, wherein a distance between the upper end of the second surface and the third surface is larger than a distance between an upper end of the fourth surface and the fifth surface.

13. The light-emitting device according to claim 3, wherein a distance between the upper end of the first surface and the upper surface of the bottom portion is larger than a distance between an upper end of the second surface and the third surface.

14. The light-emitting device according to claim 3, wherein the light-reflective member is disposed on the upper surface of the bottom portion, the first surface, the third surface, and the second surface so as not to be in contact with an upper end of the second surface.

15. The light-emitting device according to claim 3, wherein the light-emitting element comprises a substrate and a semiconductor layer located below the substrate, and
wherein the light-reflective member is located below a straight line connecting an upper end of the inner lateral surface of the wall portion and a lower end of a lateral surface of the semiconductor layer of the light-emitting element facing the inner lateral surface of the wall portion in a cross-sectional view.

16. The light-emitting device according to claim 8, wherein a distance between the upper end of the first surface and the upper surface of the bottom portion is larger than a distance between an upper end of the second surface and the third surface.

17. The light-emitting device according to claim 8, wherein the light-reflective member is disposed on the upper surface of the bottom portion, the first surface, the third surface, and the second surface so as not to be in contact with an upper end of the second surface.

18. The light-emitting device according to claim 8, wherein a distance between a surface of the light-reflective member and the light-emitting element increases from a lower side of the wall portion to an upper side of the wall portion.

19. The light-emitting device according to claim 8, wherein the light-reflective member is spaced apart from the light-emitting element in a top view.

20. The light-emitting device according to claim 8, further comprising a light-transmissive member disposed on the base member,
wherein the light-transmissive member is spaced apart from the light-reflective member.

* * * * *